United States Patent
Su et al.

(10) Patent No.: US 12,276,041 B2
(45) Date of Patent: Apr. 15, 2025

(54) METHOD FOR CRYSTAL PULLING

(71) Applicants: SICHUAN JINKO SOLAR CO., LTD., Leshan (CN); JINKO SOLAR CO., LTD., Jiangxi (CN)

(72) Inventors: Chunsheng Su, Leshan (CN); Yuang Yang, Leshan (CN); Peng Xiang, Leshan (CN); Bo Xiong, Leshan (CN)

(73) Assignees: SICHUAN JINKO SOLAR CO., LTD., Sichuan (CN); JINKO SOLAR CO., LTD., Jiangxi (CN)

( * ) Notice: Subject to any disclaimer, the term of this patent is extended or adjusted under 35 U.S.C. 154(b) by 207 days.

(21) Appl. No.: 18/149,038

(22) Filed: Dec. 30, 2022

(65) Prior Publication Data

US 2024/0125005 A1 Apr. 18, 2024

(30) Foreign Application Priority Data

Oct. 18, 2022 (CN) .......................... 202211275521.9

(51) Int. Cl.
C30B 15/22 (2006.01)
C30B 29/06 (2006.01)

(52) U.S. Cl.
CPC .............. C30B 15/22 (2013.01); C30B 29/06 (2013.01)

(58) Field of Classification Search
CPC ........ C30B 15/22; C30B 15/305; C30B 29/06
See application file for complete search history.

(56) References Cited

U.S. PATENT DOCUMENTS

| 2019/0186042 A1 | 6/2019 | Narushima et al. |
| 2022/0205136 A1 | 6/2022 | Shen et al. |
| 2022/0251724 A1* | 8/2022 | Hwang ................... C30B 15/22 |

FOREIGN PATENT DOCUMENTS

| CN | 104357901 A | | 2/2015 |
| CN | 103911654 B | * | 8/2016 |
| CN | 107794563 A | | 3/2018 |
| CN | 109097825 A | | 12/2018 |
| CN | 110552058 A | | 12/2019 |

(Continued)

OTHER PUBLICATIONS

English computer translation of WO-2011100879-A1 (Year: 2024).*

(Continued)

*Primary Examiner* — Matthew J Song
(74) *Attorney, Agent, or Firm* — USCH Law, PC

(57) ABSTRACT

A method for crystal pulling is provided. The method includes the following. The method includes performing an equal-diameter process. The equal-diameter process is performed as follows. From the first equal-diameter stage to the third equal-diameter stage, the crystal rotation rate is gradually increased after starting at a first initial crystal rotation rate, and then is kept at a constant rotation rate after gradually increasing the crystal rotation rate. The crucible rotation rate is gradually increased from a first initial crucible rotation rate to a maximum crucible rotation rate after starting at the first initial crucible rotation rate in the first equal-diameter stage, the crucible rotation rate is kept at the maximum crucible rotation rate in the second equal-diameter stage, and the crucible rotation rate is gradually decreased after the second equal-diameter stage. The method further includes a cooling process.

16 Claims, 2 Drawing Sheets

From the first equal-diameter stage to the third equal-diameter stage, gradually increase the crystal rotation rate after the crystal is rotated starting at a first initial crystal rotation rate, and keep the crystal rotation rate at a constant rotation rate after gradually increasing the crystal rotation rate — 201

Gradually increase the crucible rotation rate to a maximum crucible rotation rate after the crucible is rotated starting at a first initial crucible rotation rate in the first equal-diameter stage, keep the crucible rotation rate at the maximum crucible rotation rate in the second equal-diameter stage, and gradually decrease the crucible rotation rate after the second equal-diameter stage — 202

Gradually decrease the furnace pressure after starting at a first initial furnace pressure — 203

Fill the inert gas at a first initial inert gas flow rate in the first equal-diameter stage, and gradually increase inert gas flow rate after the first equal-diameter stage — 204

(56) References Cited

FOREIGN PATENT DOCUMENTS

| | | | |
|---|---|---|---|
| CN | 113564692 A | 10/2021 | |
| CN | 113652737 A | 11/2021 | |
| CN | 114481301 A | 5/2022 | |
| CN | 114808112 A | 7/2022 | |
| CN | 115182042 A | 10/2022 | |
| DE | 112017003224 B4 | 9/2021 | |
| JP | H0971493 A | 3/1997 | |
| JP | 2005015314 A | 1/2005 | |
| JP | 2011093778 A | 5/2011 | |
| WO | 2008128378 A1 | 10/2008 | |
| WO | WO-2011100879 A1 * | 8/2011 | ............. C30B 15/00 |
| WO | 2022052999 A1 | 3/2022 | |

OTHER PUBLICATIONS

English computer translation of CN-103911654 (Year: 2024).*
Sichuan Jinko Solar Co., Ltd., et al., Extended European Search Report, EP 22217340.3, Aug. 10, 2023, 5 pgs.
Mingming Wu, et al., "Research on Oxygen Control Technology in Czochralski Single Crystal Silicon Growth", No. 11, New Technology & New Process, Nov. 25, 2013, 4 pgs.
Yuqing Hao, et al., "Study on Radial Oxygen Uniformity of $125 mm Cz—Si Crystal", vol. 22, No. 6, Chinese Journal of Rare Metals, Nov. 4, 1998, 3 pgs.

* cited by examiner

METHOD FOR CRYSTAL PULLING

CROSS REFERENCE TO RELATED APPLICATIONS

The present application claims the benefit of priority under the Paris Convention to Chinese Patent Application No. 202211275521.9 filed on Oct. 18, 2022, which is incorporated herein by reference in its entirety.

TECHNICAL FIELD

The disclosure relates to the field of monocrystalline silicon production technologies, and more specifically to a method for crystal pulling.

BACKGROUND

With the continuous development of photovoltaic industry, there are increasingly demands for high-efficiency solar cells, and therefore, the quality of monocrystalline silicon rods which are used as substrate materials of most semiconductor components, is also put forward higher requirements.

However, during pulling of the monocrystalline silicon rods, distribution of radial resistivity of the prepared monocrystalline silicon rods is uneven, which may affect the electrical performance of solar cells.

Therefore, how to provide a method for crystal pulling to improve the uniformity of the radial resistivity is a technical problem to be solved.

SUMMARY

In view of the above, a method for crystal pulling is provided. The method includes the following. The method includes performing an equal-diameter process. According to a growth length of crystal, the equal-diameter process is divided into a first equal-diameter stage, a second equal-diameter stage, and a third equal-diameter stage. The equal-diameter process is performed as follows. A crystal rotation rate, a crucible rotation rate, a furnace pressure, and an inert gas flow rate in the equal-diameter process are sequentially adjusted. From the first equal-diameter stage to the third equal-diameter stage, the crystal rotation rate is gradually increased after starting at a first initial crystal rotation rate, and then is kept at a constant rotation rate after gradually increasing the crystal rotation rate. The crucible rotation rate is gradually increased from a first initial crucible rotation rate to a maximum crucible rotation rate after starting at the first initial crucible rotation rate in the first equal-diameter stage, the crucible rotation rate is kept at the maximum crucible rotation rate in the second equal-diameter stage, and the crucible rotation rate is gradually decreased after the second equal-diameter stage. The furnace pressure is gradually decreased after starting at a first initial furnace pressure. The inert gas flow rate is started at a first initial inert gas flow rate in the first equal-diameter stage, and is gradually increased after the first equal-diameter stage. The method further includes a cooling process in which a furnace pressure and an inert gas flow rate are sequentially adjusted.

In some embodiments, the cooling process is divided into a first cooling stage, a second cooling stage, and a third cooling stage. The cooling process is performed as follows. From the first cooling stage to the third cooling stage: the crystal rotation rate is kept at a second initial crystal rotation rate after starting at the second initial crystal rotation rate, the crucible rotation rate is kept at a second initial crucible rotation rate after starting at the second initial crucible rotation rate, the furnace pressure is gradually reduced after starting at a second initial furnace pressure, and the inert gas flow rate is gradually increased after starting at a second initial inert gas flow rate.

In some embodiments, the first initial crystal rotation rate is less than the second initial crystal rotation rate, the first initial crucible rotation rate is greater than the second initial crucible rotation rate, the first initial furnace pressure is greater than the second initial furnace pressure, and the first initial inert gas flow rate is less than the second initial inert gas flow rate.

In some embodiments, in the first equal-diameter stage, the crystal rotation rate is gradually increased from the first initial crystal rotation rate to an equal-diameter crystal rotation rate; and in the second equal-diameter stage and the third equal-diameter stage, the crystal rotation rate is kept at the equal-diameter crystal rotation rate. The equal-diameter crystal rotation rate is the second initial crystal rotation rate.

In some embodiments, the first initial crystal rotation rate is 8 rotations per minute (RPM), the equal-diameter crystal rotation rate is 10 RPM, and the second initial crystal rotation rate is 10 RPM.

In some embodiments, in the third equal-diameter stage, the crucible rotation rate is gradually decreased from the maximum crucible rotation rate to an equal-diameter crucible rotation rate, where the equal-diameter crucible rotation rate is less than the first initial crucible rotation rate, and the equal-diameter crucible rotation rate is greater than the second initial crucible rotation rate.

In some embodiments, the first initial crucible rotation rate is 6 RPM, the maximum crucible rotation rate is 9 RPM, the equal-diameter crucible rotation rate is 5 RPM, and the second initial crucible rotation rate is 2 RPM.

In some embodiments, in the equal-diameter process, the furnace pressure is gradually decreased from the first initial furnace pressure to an equal-diameter furnace pressure, where the equal-diameter furnace pressure is the second initial furnace pressure.

In some embodiments, the first initial furnace pressure is 13 Torr, the equal-diameter furnace pressure is 8 Torr, and the second initial furnace pressure is 8 Torr.

In some embodiments, in the equal-diameter process, the inert gas flow rate is gradually increased from the first initial inert gas flow rate to an equal-diameter flow rate, where the equal-diameter flow rate is less than the second initial inert gas flow rate.

In some embodiments, the first initial inert gas flow rate is 80 liter per minute (LPM), the equal-diameter flow rate is 100 LPM, and the second initial inert gas flow rate is 120 LPM.

In some embodiments, from the first cooling state to the third cooling state, the furnace pressure is gradually decreased from the second initial furnace pressure to a cooling furnace pressure, and the inert gas flow rate is gradually increased from the second initial inert gas flow rate to a cooling flow rate.

In some embodiments, the second initial furnace pressure is 8 Torr, and the cooling furnace pressure is 6 Torr.

In some embodiments, the crystal has a growth length in a range of 0 mm to 600 mm in the first equal-diameter stage, a growth length in a range of 600 mm to 1500 mm in the second equal-diameter stage, and a growth length in a range of 1500 mm to 5000 mm in the third equal-diameter stage.

In some embodiments, a cooling time of the first cooling stage and the second cooling stage is 1800 s, and a cooling time of the third cooling stage is 4200 s.

In some embodiments, a cooling time of the first cooling stage and the second cooling stage is 1500 s, 2000 s or 2200 s, and a cooling time of the third cooling stage is 3800 s, 4000 s, or 4500 s.

BRIEF DESCRIPTION OF THE DRAWINGS

The accompanying drawings, which are incorporated in and form a part of the specification, show embodiments of the disclosure and are used together with their descriptions to explain the principles of the disclosure.

DETAILED DESCRIPTION OF THE EMBODIMENTS

Various exemplary embodiments of the disclosure will now be described in detail with reference to the accompanying drawings. It is to be noted that the relative arrangements of components, and the relative order of steps, numeric expressions, and values set forth in these embodiments do not limit the scope of the disclosure unless otherwise specified.

The following description of at least one exemplary embodiment is illustrative only and is not intended to limit the disclosure and application or use of the disclosure.

Techniques, methods, and devices known to those of ordinary skill in the relevant art may not be discussed in detail, but where appropriate, such techniques, methods, and devices should be regarded as part of the specification.

In all examples shown and discussed herein, any specific value should be interpreted as illustrative only and not as a limitation. Therefore, other examples of exemplary embodiments may have different values.

It is to be noted that like numerals and letters denote like terms in the following drawings, and therefore, once an item is defined in one drawing, it does not need to be further discussed in subsequent drawings.

Figure 4:
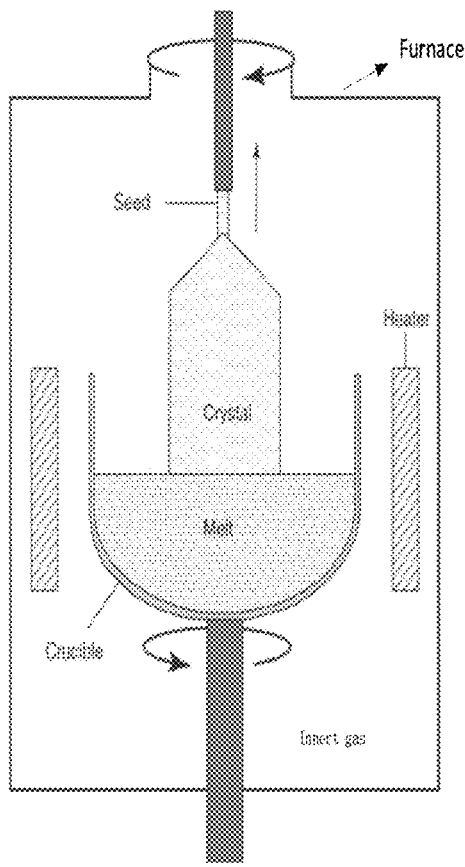
FIG. 4 is a schematic diagram of a system that can be employed to perform a method for crystal pulling according to some embodiments.

In some embodiments, a monocrystal silicon rod is grown through the so-called Czochralski crystal growth process. FIG. 4 illustrates a schematic diagram of a Czochralski crystal growth system that can be employed to perform a method for crystal pulling according to some embodiments. As shown in FIG. 4, by placing polysilicon silicon materials in a quartz crucible for melting, during Czochralski growth of single crystal, seed crystal is in contact with melt, so that molten silicon at a solid-liquid interface is cooled and crystallized along the seed crystal, and grows by slowly pulling out the seed crystal. After necking is completed, a growth diameter of the crystal is controlled to be increased by reducing a pulling rate and/or the melt temperature until the target diameter is reached. After shoulder turning, the crystal can be controlled to enter an equal-diameter growth stage by controlling the pulling rate and the melt temperature. Finally, by increasing the pulling rate and melt temperature, a diameter of a growth surface of the crystal is gradually reduced to form a tail cone until the crystal leaves the melt surface, that is, growth of monocrystalline silicon rod is completed.

During pulling of existing single crystal silicon rod, distribution of radial resistivity of the prepared single crystal silicon rod is uneven, which may affect the electrical performance of solar cells.

Based on the above research, the disclosure provides a method for crystal pulling, which can improve uniformity of radial resistivity of crystal, and effectively suppress the oxygen entering the crystal from silicon liquid, thereby reducing the percentage of oxygen at the head of the crystal, and improving the crystallization rate and the yield. A method for crystal pulling with the above technical effect provided by the disclosure is described in detail as follows.

Figure 1:
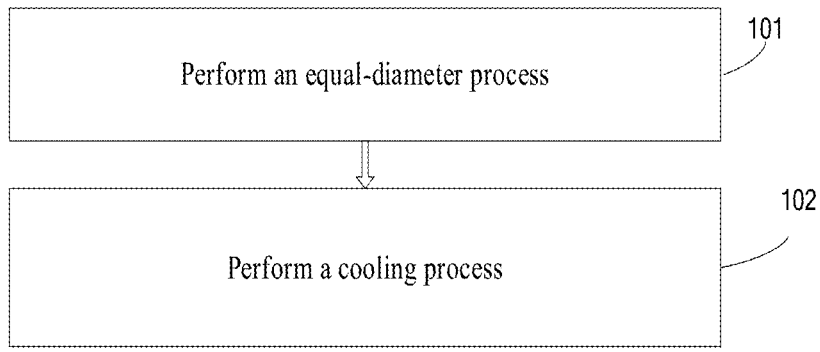
FIG. 1 is a flow chart illustrating a method for crystal pulling according to embodiments of the disclosure.

FIG. 1 is a flow chart illustrating a method for crystal pulling according to embodiments of the disclosure. The method can be performed using a system including a crucible, a furnace, and a heater, such as the system illustrated in FIG. 4, according to some embodiments. As illustrated in FIG. 1, the method includes an equal-diameter process and a cooling process.

As shown in FIG. 1, the method begins at block 101.

At block 101, the equal-diameter process is performed.

In some embodiments, the equal-diameter process is divided into a first equal-diameter stage, a second equal-diameter stage, and a third equal-diameter stage according to a growth length of crystal. The equal-diameter process is performed by sequentially adjusting a rotation rate of crystal (crystal rotation rate), a rotation rate of a crucible (crucible rotation rate), a pressure in a furnace (a furnace pressure), and a flow rate of inert gas (i.e., inert gas flow rate).

At block 102, the cooling process is performed.

In some embodiments, the cooling process is divided into a first cooling stage, a second cooling stage, and a third cooling stage, and the cooling process is performed by sequentially adjusting a furnace pressure and an inert gas flow rate.

The equal-diameter process and the cooling process are respectively described in detail below.

Figure 2:
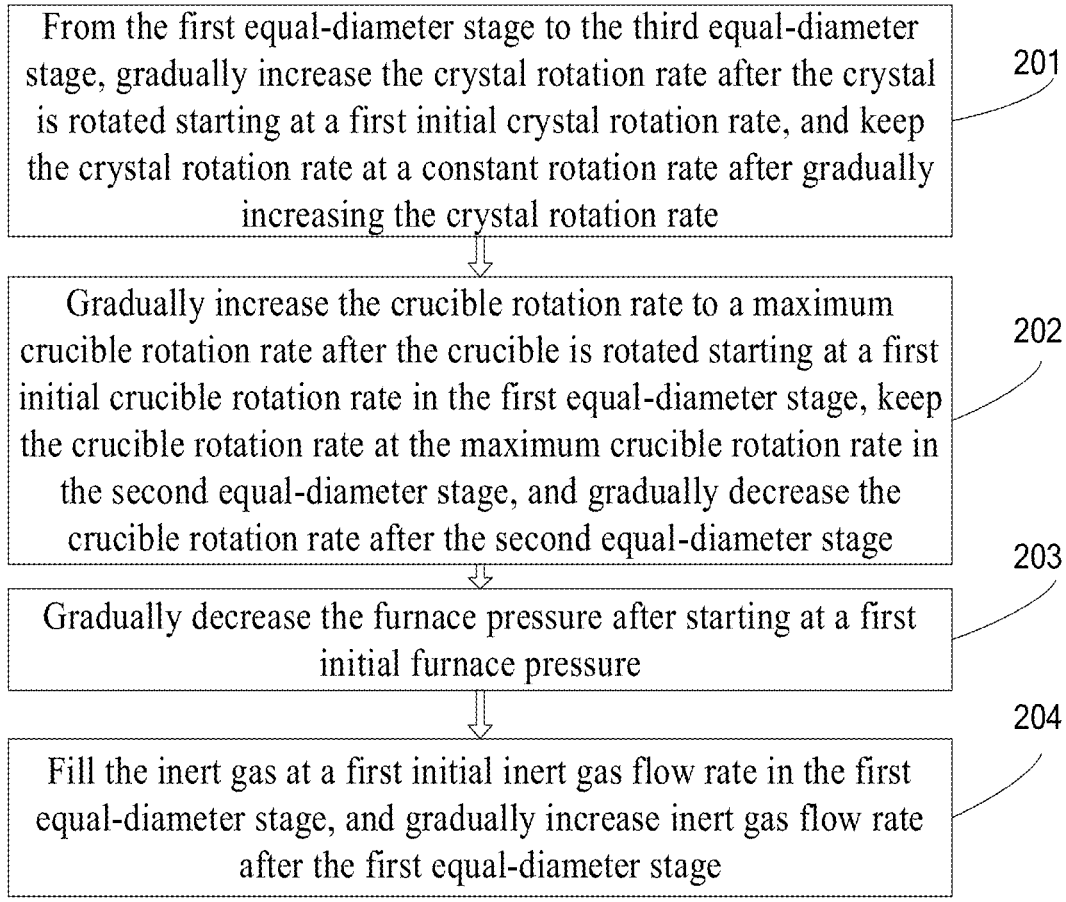
FIG. 2 is a flow chart illustrating a method for crystal pulling in an equal-diameter process according to embodiments of the disclosure.

FIG. 2 is a flow chart illustrating a method for crystal pulling in an equal-diameter process according to embodiments of the disclosure. The equal-diameter process is divided into a first equal-diameter stage, a second equal-diameter stage, and a third equal-diameter stage according to a growth length of crystal. As illustrated in FIG. 2, the method begins at block 201.

At block 201, from the first equal-diameter stage to the third equal-diameter stage, the crystal rotation rate is increased gradually after the crystal is rotated starting at a first initial crystal rotation rate, and then the crystal rotation rate is kept at a constant rotation rate after the crystal rotation rate is gradually increased.

In one example, from the first equal-diameter stage to the third equal-diameter stage, the crystal rotation rate is increased gradually to maximum crystal rotation rate after the crystal is rotated starting at a first initial crystal rotation rate, and then the crystal rotation rate is kept at the maximum crystal rotation rate.

At block 202, the crucible rotation rate is gradually increased to a maximum crucible rotation rate after the crucible is rotated starting at a first initial crucible rotation rate in the first equal-diameter stage, the crucible rotation rate is kept at the maximum crucible rotation rate in the second equal-diameter stage, and the crucible rotation rate is gradually decreased after the second equal-diameter stage.

At block 203, the furnace pressure is gradually reduced after starting at a first initial furnace pressure.

At block 204, the inert gas flow rate is started at a first initial inert gas flow rate in the first equal-diameter stage, and is gradually increased after the first equal-diameter stage.

It can be understood that the equal-diameter process includes three stages: the first equal-diameter stage, the second equal-diameter stage, and the third equal-diameter stage, where a growth length of the crystal in the equal-diameter process can be described in following three stages: a length of an entry section in the first equal-diameter stage, a length of a growth section in the second equal-diameter stage, and a length of a stabilization section in the third equal-diameter stage. In each equal-diameter stage, the crystal rotation rate, the crucible rotation rate, the furnace pressure, and the inert gas flow rate for crystal growth are adjusted, and in the cooling process, the furnace pressure and the inert gas flow rate are adjusted, so as to avoid uneven distribution of impurity concentration in the radial direction of the crystal, suppress the attenuation rate of the resistivity of the crystal, and improve uniformity of the radial resistivity of the crystal. From the first equal-diameter stage to the third equal-diameter stage, the crystal rotation rate is increased gradually after the crystal is rotated starting at the first initial crystal rotation rate, and then the crystal rotation rate is kept at a constant rotation rate. The crucible rotation rate is gradually increased to the maximum crucible rotation rate after the crucible is rotated starting at the first initial crucible rotation rate in the first equal-diameter stage, the crucible rotation rate is kept at the maximum crucible rotation rate in the second equal-diameter stage, and the crucible rotation rate is gradually reduced after the second equal-diameter stage. Specifically, in the first equal-diameter stage of the equal-diameter process, not only the diameter of the crystal should be controlled well, but also the dislocation-free growth of the crystal should be maintained. The crystal rotation rate is gradually increased to the maximum rotation rate after the crystal is rotated starting at the first initial crystal rotation rate and the crucible rotation rate is gradually increased to the maximum rotation rate after the crucible is rotated starting at the first initial crucible rotation rate. Since the crystal rotation rate and the crucible rotation rate are gradually increased, the melt below the solid-liquid interface flows upward under the action of rotation of the crystal, and the temperature of the melt at the solid-liquid interface rises continuously. The increase of the temperature of the melt at the solid-liquid interface can effectively avoid undercooling and improve the stability of the growth of the crystal. In the second equal-diameter stage of the equal-diameter process, to maintain stable crystal growth and reduce the influence of hot air flow of the melt on the solid-liquid interface, the crystal rotation rate and the crucible rotation rate each are kept at a rotation rate at the end of the first equal-diameter stage. In the third equal-diameter stage of the equal-diameter process, since excessive crucible rotation rate may cause more violent movement of the melt, metal ions on an inner wall of the crucible react with the molten silicon liquid, resulting in impurities that are not conducive to the growth of the crystal. Moreover, the impurities move more violently with the melt, and once there are too many impurities, it is easy to cause crystal bracts and seriously affect quality of the crystal. Therefore, when the crystal grows to a certain length, the crystal rotation rate is kept unchanged, and the crucible rotation rate is gradually reduced, so that the forced convection of silicon liquid in the crucible can be changed, the convex degree of the growth interface of the crystal can be reduced to suppress appearance of facets, and the inhibition effect on thermal convection at the growth interface can be enhanced. Therefore, it is possible to avoid the uneven distribution of the radial resistivity of the crystal due to the temperature fluctuation of the solid-liquid interface caused by the thermal convection, and improve the uniformity of the radial resistivity of the crystal. In addition, the low crucible rotation rate reduces the erosion and corrosion of silicon liquid to walls of the crucible, a reaction speed of chemical reaction between the silicon liquid and the crucible is correspondingly slowed down, thus reducing the generation of oxygen. The convection speed of the silicon liquid is reduced, which reduces the oxygen entering the crystal-induced silicon liquid, such that the oxygen content at the head of the crystal rod in the generated monocrystalline silicon rod is obviously reduced, and the quality of the monocrystalline silicon can be improved. The furnace pressure gradually decreases after starting at the first initial furnace pressure, the inert gas is filled at the first initial inert gas flow rate in the first equal-diameter stage, and the flow rate of the inert gas is gradually increased after the first equal-diameter stage, thereby accelerating the volatilization of silicon oxide gas, reducing the oxygen content in the silicon liquid, and making the growth interface of the crystal smoother. Therefore, the uniformity of the radial resistivity of the crystal and the crystallization rate and the yield can be improved.

It is to be noted that in operations at block 201, block 202, block 203, and block 204, the crystal rotation rate, the crucible rotation rate, the furnace pressure, and the inert gas flow rate can be adjusted in any order. In addition, the inert gas can be argon.

Figure 3:
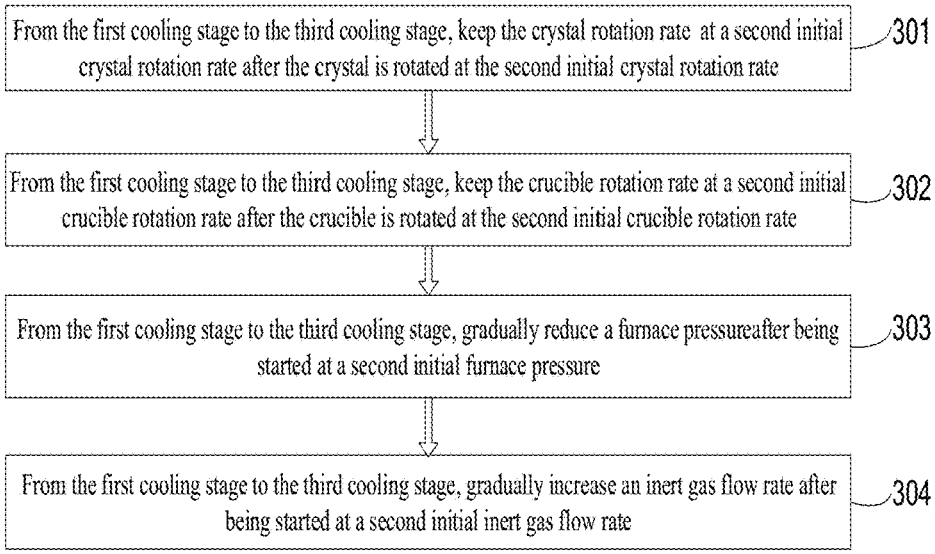
FIG. 3 is a flow chart illustrating a method for crystal pulling in a cooling process according to embodiments of the disclosure.

Optionally, FIG. 3 is a flow chart illustrating a method for crystal pulling in a cooling process according to embodiments of the disclosure. The cooling process of the crystal includes a first cooling stage, a second cooling stage, and a third cooling stage. The cooling process is performed by sequentially adjusting a furnace pressure and an inert gas flow rate. Specifically, as illustrated in FIG. 3, the method for crystal pulling begins at block 301.

At block 301, from the first cooling stage to the third cooling stage, the crystal rotation rate is kept at a second initial crystal rotation rate after the crystal is rotated at the second initial crystal rotation rate.

At block 302, from the first cooling stage to the third cooling stage, the crucible rotation rate is kept at a second initial crucible rotation rate after the crucible is rotated at the second initial crucible rotation rate.

At block 303, from the first cooling stage to the third cooling stage, a furnace pressure is gradually reduced after starting at a second initial furnace pressure.

At block 304, from the first cooling stage to the third cooling stage, an inert gas flow rate is gradually increased after starting at a second initial inert gas flow rate.

It can be understood that the cooling process of the crystal includes three stages: a first cooling stage, a second cooling stage, and a third cooling stage. In each cooling stage, the crystal rotation rate, the crucible rotation rate, the furnace pressure, and the inert gas flow rate for crystal growth are adjusted, so as to avoid uneven distribution of impurity concentration in the radial direction of the crystal, suppress the attenuation rate of crystal resistivity, and improve the uniformity of the radial resistivity of the crystal. From the first cooling stage to the third cooling stage, the crystal rotation rate is kept at the second initial crystal rotation rate after being stated at the second initial crystal rotation rate, the crucible rotation rate is kept at the second initial crucible rotation rate after being stated at the second initial crucible rotation rate, the furnace pressure gradually decreases after being stated at the second initial furnace pressure, and the inert gas flow rate gradually increases after starting at the second initial inert gas flow rate, so as to quickly cool the crystals coming out of furnace at high temperature, and eliminate some original oxygen heat donors, promote oxygen precipitation, thereby improving the uniformity of the radial resistivity of the crystals, and improving the crystallization rate and the yield.

It is to be noted that in operations at block 301, block 302, block 303, and block 304, the crystal rotation rate, the crucible rotation rate, the furnace pressure, and the inert gas flow rate can be adjusted in any order. In addition, the inert gas can be argon.

Embodiments

Continuing to combine following Tables 1 and 2, Table 1 is a table of crystal pulling parameters in the equal-diameter process of embodiments, and Table 2 is a table of crystal pulling parameters in the cooling process of embodiments.

TABLE 1 a table of crystal pulling parameters in the equal-diameter process of embodiments

| Length (mm) | crystal rotation rate (RPM) | crucible rotation rate (RPM) | Ar flow rate (LPM) | furnace pressure (Torr) |
|---|---|---|---|---|
| 0 | 8 | 6 | 80 | 13 |
| 50 | 8.5 | 6.3 | 80 | 13 |
| 150 | 9 | 7 | 80 | 12 |
| 300 | 9.5 | 8 | 80 | 12 |
| 600 | 10 | 9 | 80 | 11 |
| 1000 | 10 | 9 | 85 | 11 |
| 1500 | 10 | 9 | 90 | 10 |
| 2000 | 10 | 8 | 90 | 10 |
| 2500 | 10 | 7 | 95 | 9 |
| 3000 | 10 | 6.3 | 95 | 9 |
| 3500 | 10 | 6 | 100 | 8 |
| 4000 | 10 | 6 | 100 | 8 |
| 5000 | 10 | 5 | 100 | 8 |

TABLE 2 a table of crystal pulling parameters in the cooling process of embodiments

| cooling process | crystal rotation rate (RPM) | crucible rotation rate (RPM) | Ar flow rate (LPM) | furnace pressure (Torr) |
|---|---|---|---|---|
| first cooling stage | 10 | 2 | 120 | 8 |
| second cooling stage | 10 | 2 | 140 | 7 |
| third cooling stage | 10 | 2 | 150 | 6 |

Comparative Examples

Continuing to combine following Tables 3 and 4, Table 3 is a table of crystal pulling parameters in a conventional equal-diameter process, and Table 4 is a table of crystal pulling parameters in a conventional cooling process. The comparative example differs from the above embodiments in that: the crystal rotation rate, the crucible rotation rate, the furnace pressure, and the argon flow rate, where the crystal rotation rate, the crucible rotation rate, the furnace pressure, and the argon flow rate in the comparative example are conventional solutions.

TABLE 3 a table of crystal pulling parameters in a conventional equal-diameter process

| Length (mm) | crystal rotation rate (RPM) | crucible rotation rate (RPM) | Ar flow rate (LPM) | furnace pressure (Torr) |
|---|---|---|---|---|
| 0 | 8 | 6 | 80 | 13 |
| 50 | 8 | 6.3 | 80 | 13 |
| 150 | 8 | 7 | 80 | 13 |
| 300 | 8 | 8 | 80 | 13 |
| 600 | 8 | 8 | 80 | 13 |
| 1000 | 8 | 8 | 80 | 13 |
| 1500 | 8 | 8 | 80 | 13 |
| 2000 | 8 | 8 | 80 | 13 |
| 2500 | 8 | 8 | 80 | 13 |
| 3000 | 8 | 8 | 80 | 13 |
| 3500 | 8 | 8 | 80 | 13 |
| 4000 | 8 | 8 | 80 | 13 |
| 5000 | 8 | 8 | 80 | 13 |

TABLE 4 a table of crystal pulling parameters in a conventional cooling process

| cooling process | crystal rotation rate (RPM) | crucible rotation rate (RPM) | Ar flow rate (LPM) | furnace pressure (Torr) |
|---|---|---|---|---|
| first cooling stage | 5 | 2 | 80 | 13 |
| second cooling stage | 5 | 2 | 80 | 13 |
| third cooling stage | 5 | 2 | 80 | 13 |

In order to explain the beneficial effect of the radial resistivity of the crystals prepared in this example, four measuring points are selected from an edge and two measuring points are selected from the center of the crystal made through this example and four measuring points are selected from an edge and two measuring points are selected from the center of the crystal made in the comparative example to carry out resistivity comparison. The comparison results are shown in Table 5, which shows a radial resistivity and a percentage of a change of radial resistivity under different processes.

TABLE 5 radial resistivity and percentage change of radial resistivity under different processes

| | central two-point resistivity Ω cm | | edge four-point resistivity Ω cm | | | | radial resistivity change % |
|---|---|---|---|---|---|---|---|
| Embodiments | 2.30 | 2.27 | 2.15 | 2.12 | 2.10 | 2.15 | 6.78% |
| comparative example | 2.54 | 2.53 | 2.23 | 2.20 | 2.07 | 2.13 | 14.89% |

It is obvious from data in Table 5 that with the method for crystal pulling of embodiments, the change of the percentage of the radial resistivity is reduced from 14.89% to 6.78% by adjusting the crystal rotation rate, the crucible rotation rate, the furnace pressure, and the inert gas flow rate in the equal-diameter process and the furnace pressure and the inert gas flow rate in the cooling process in turn according to the growth length of the crystal, which improves the uniformity of the radial resistivity of the crystal, and increases the crystallization rate and the yield.

Optionally, the first initial crystal rotation rate is less than the second initial crystal rotation rate, the first initial crucible rotation rate is greater than the second initial crucible rotation rate, the first initial furnace pressure is greater than the second initial furnace pressure, and the first initial inert gas flow rate is less than the second initial inert gas flow rate.

It can be understood that in the equal-diameter process, the crystal rotation rate is increased gradually to the maximum rotation rate after the crystal is rotated starting at the first initial crystal rotation rate, and the crucible rotation rate is gradually increased to the maximum crucible rotation rate after the crucible is rotated starting at the first initial crucible rotation rate. Since the crystal rotation rate and the crucible rotation rate are gradually increased, the melt below the solid-liquid interface flows upward under the action of rotation of the crystal, and the temperature of the melt at the solid-liquid interface rises continuously. The increase of the temperature of the melt at the solid-liquid interface can effectively avoid undercooling and improve the stability of the growth of the crystal. In order to maintain stable growth of the crystal and reduce the influence of hot air flow of the melt on the solid-liquid interface, in the second equal-diameter stage and the third equal-diameter stage, the crystal rotation rate is kept at the maximum rotation rate at the end of the first equal-diameter stage, and the crystal is rotated at the second initial crystal rotation rate in the cooling process, where the first initial crystal rotation rate is less than the second initial crystal rotation rate. The crucible rotation rate is kept at the maximum crucible rotation rate at an end of the first equal-diameter stage, and is gradually decreased in the third equal-diameter stage. The crucible is rotated at the second initial crucible rotation rate in the cooling process, where the first initial crucible rotation rate is greater than the second initial crucible rotation rate. Therefore, the forced convection of silicon liquid in the crucible can be changed, the convex degree of the growth interface of the crystal can be reduced to suppress appearance of facets, and the inhibition effect on thermal convection at the growth interface can be enhanced, thereby avoiding the uneven distribution of the radial resistivity of the crystal due to the temperature fluctuation of the solid-liquid interface caused by the thermal convection, and improving the uniformity of the radial resistivity of the crystal. In addition, the low crucible rotation rate reduces the erosion and corrosion of silicon liquid to walls of the crucible, a reaction speed of chemical reaction between the silicon liquid and the crucible is correspondingly slowed down, thus reducing the generation of oxygen. The convection speed of the silicon liquid is reduced, which reduces the oxygen entering the crystal-induced silicon liquid, such that the oxygen content at the head of the crystal rod in the generated monocrystalline silicon rod is obviously reduced, and the quality of the monocrystalline silicon can be improved. Form the first equal-diameter stage to the third equal-diameter stage, the furnace pressure gradually decreases after starting at the first initial furnace pressure and the furnace pressure in the cooling process is started at the second initial furnace pressure. The inert gas is filled at the first initial inert gas flow rate in the first equal-diameter stage, the flow rate of the inert gas is gradually increased after the first equal-diameter stage, and the inert gas is filled starting at the second initial inert gas flow rate and gradually increased in the cooling process. The first initial furnace pressure is greater than the second initial furnace pressure, and the first initial inert gas flow rate is less than the second initial inert gas flow rate, thereby accelerating the volatilization of silicon oxide gas, reducing the oxygen content in the silicon liquid, and making the growth interface of the crystal smoother. Therefore, the uniformity of the radial resistivity of the crystal and the crystallization rate and the yield can be improved.

Optionally, in the first equal-diameter stage, the crystal rotation rate is gradually increased from the first initial crystal rotation rate to an equal-diameter crystal rotation rate. In the second equal-diameter stage and the third equal-diameter stage, the crystal rotation rate is kept at the equal-diameter crystal rotation rate. The equal-diameter crystal rotation rate is the second initial crystal rotation rate.

It can be understood that the growth length of the crystal in the equal-diameter process can be described in following three stages: the length of the entry section in the first equal-diameter stage, the length of the growth section in the second equal-diameter stage, and the length of the stabilization section in the third equal-diameter stage. In each equal-diameter stage, the crystal rotation rate for crystal growth is controlled, so as to avoid the uneven distribution of impurity concentration in the radial direction of the crystal, suppress the attenuation rate of the resistivity of the crystal, and improve the uniformity of the radial resistivity of the crystal. From the first equal-diameter stage to the third equal-diameter stage, the crystal rotation rate is increased gradually to the equal-diameter crystal rotation rate after the crystal is rotated starting at the first initial crystal rotation rate, and then the crystal is rotated steadily with the equal-diameter crystal rotation rate (e.g., the above maximum crystal rotation rate). The crystal is rotated starting at the second initial crystal rotation rate in the cooling process, and the equal-diameter crystal rotation rate is the second initial crystal rotation rate. For example, the first initial crystal rotation rate can be 8 rotations per minute (RPM), the equal-diameter crystal rotation rate can be 10 RPM, and the second initial crystal rotation rate can also be 10 rpm. That is, the crystal is first rotated starting at the first initial crystal rotation rate of 8 rpm, and then the crystal rotation rate is gradually increased to the equal-diameter crystal rotation rate of 10 rpm. Thereafter, the crystal rotation rate is kept at a constant equal-diameter crystal rotation rate of 10 RPM, and the crystal is rotated at the second initial crystal rotation rate of 10 RPM in the cooling process. Specifically, in the first equal-diameter stage of the equal-diameter process, not only the diameter of the crystal should be well controlled, but also the dislocation-free growth of the crystal should be maintained. After the crystal is rotated at the first initial crystal rotation rate, the crystal rotation rate is gradually increased to the equal-diameter crystal rotation rate. Because of the gradual increase of the crystal rotation rate, the melt under the solid-liquid interface flows upward under the action of crystal rotation, and the temperature of the melt at the solid-liquid interface increases continuously. The increase of the temperature of the melt at the solid-liquid interface can effectively reduce undercooling and improve the stability of crystal growth. In the second equal-diameter stage and the third equal-diameter stage, the crystal rotation rate is kept at the equal-diameter crystal rotation rate (e.g., the above maximum crystal rotation rate). The equal-diameter crystal rotation rate being the second initial crystal rotation rate can ensure the stable crystal growth and reduce the influence of hot melt flow on the solid-liquid interface.

Optionally, in the third equal-diameter stage, the crucible rotation rate is gradually reduced to an equal-diameter crucible rotation rate from the maximum crucible rotation rate. The equal-diameter crucible rotation rate is less than the first initial crucible rotation rate, and the equal-diameter crucible rotation rate is greater than the second initial crucible rotation rate.

It can be understood that the growth length of the crystal in the equal-diameter process can be described in following three stages: the length of the entry section in the first equal-diameter stage, the length of the growth section in the second equal-diameter stage, and the length of the stabilization section in the third equal-diameter stage. In each equal-diameter stage, the crucible rotation rate for crystal growth is controlled, so as to avoid the uneven distribution of impurity concentration in the radial direction of the crystal, suppress the attenuation rate of the resistivity of the crystal, and improve the uniformity of the radial resistivity of the crystal. The crucible rotation rate is increased gradually to the maximum crucible rotation rate after the crucible is rotated starting at the first initial crucible rotation rate in the first equal-diameter stage, and then the crucible rotation rate is kept at the maximum crucible rotation rate in the second equal-diameter stage. After the second equal-diameter stage, the crucible rotation rate is gradually decreased to the equal-diameter crucible rotation rate, and the crucible is rotated starting at the second initial crucible rotation rate in the cooling process. The equal-diameter crucible rotation rate is less than the first initial crucible rotation rate and greater than the second initial crucible rotation rate. For example, the first initial crucible rotation rate can be 6 RPM, the maximum crucible rotation rate can be 9 RPM, the equal-diameter crucible rotation rate can be 5 RPM, and the second initial crucible rotation rate is 2 RPM. That is, in the first equal-diameter stage, the crucible is first rotated starting at the first initial crucible rotation rate of 6 RPM, and then the crucible rotation rate is gradually increased to the maximum crucible rotation rate of 9 RPM. In the second equal-diameter stage, the crucible rotation rate is kept at the maximum crucible rotation rate of 9 RPM. After the second equal-diameter stage, the crucible rotation rate is gradually decreased to the equal-diameter crucible rotation rate of 5 RPM. The crucible is rotated at the second initial crucible rotation rate of 2 RPM in the cooling process. Specifically, in the first equal-diameter stage, the crucible rotation rate is gradually increased to the maximum crucible rotation rate after the crucible is started rotating at the first initial crucible rotation rate. Because of the gradual increase of the crucible rotation rate, the melt under the solid-liquid interface flows upward under the action of rotation of crystal, and the temperature of the melt at the solid-liquid interface increases continuously. The increase of the temperature of the melt at the solid-liquid interface can effectively reduce undercooling and improve the stability of crystal growth. In the second equal-diameter stage, to ensure stable crystal growth and reduce the influence of melt hot air flow on solid-liquid interface, the crucible rotation rate is kept at the maximum crucible rotation rate at the end of the first equal-diameter stage. In the third equal-diameter stage, when the crystal grows to a certain length, the crucible rotation rate is gradually reduced from the maximum crucible rotation rate to the equal-diameter crucible rotation rate, so that the forced convection of the silicon liquid in the crucible can be changed, the convex degree of the growth interface of the crystal can be reduced to suppress appearance of facets, and the inhibition effect on thermal convection at the growth interface can be enhanced. Therefore, it is possible to avoid the uneven distribution of the radial resistivity of the crystal due to the temperature fluctuation of the solid-liquid interface caused by the thermal convection, and improve the uniformity of the radial resistivity of the crystal. In addition, the low crucible rotation rate reduces the erosion and corrosion of the silicon liquid to walls of the crucible, a reaction speed of chemical reaction between the silicon liquid and the crucible is correspondingly slowed down, thus reducing the generation of oxygen. The convection speed of the silicon liquid is reduced, which reduces the oxygen entering the crystal-induced silicon liquid, such that the oxygen content at the head of the crystal rod in the generated monocrystalline silicon rod is obviously reduced, and the quality of the monocrystalline silicon can be improved.

Optionally, the furnace pressure is gradually reduced from the first initial furnace pressure to an equal-diameter furnace pressure in the equal-diameter process, and the equal-diameter furnace pressure is the second initial furnace pressure.

It can be understood that the growth length of the crystal in the equal-diameter process can be described in following three stages: the length of the entry section in the first equal-diameter stage, the length of the growth section in the second equal-diameter stage, and the length of the stabilization section in the third equal-diameter stage. In each equal-diameter stage, the furnace pressure is controlled so as to avoid the uneven distribution of impurity concentration in the radial direction of the crystal, suppress the attenuation rate of the resistivity of the crystal, and improve the uniformity of the radial resistivity of the crystal. From the first equal-diameter stage to the third equal-diameter stage, the furnace pressure is gradually reduced from the first initial furnace pressure to the equal-diameter furnace pressure after starting at the first initial furnace pressure. In the cooling process, the furnace pressure is started at the second initial furnace pressure, and the equal-diameter furnace pressure is the second initial furnace pressure. For example, the first initial furnace pressure may be 13 Torr, the equal-diameter furnace pressure can be 8 Torr, and the second initial furnace pressure may also be 8 Torr. That is, the furnace pressure is gradually decreased from the first initial furnace pressure of 13 Torr to the equal-diameter furnace pressure of 8 Torr after starting at the first initial furnace pressure of 13 Torr. In the cooling process, the furnace pressure is set to the second initial furnace pressure of 8 Torr, so as to accelerate the volatilization of silicon oxide gas, reduce the oxygen content in the silicon liquid, and make the growth interface of the crystal smoother. Therefore, the uniformity of the radial resistivity of the crystal and the crystallization rate and the yield can be improved.

Optionally, in the equal-diameter process, the inert gas flow rate is gradually increased from the first initial inert gas flow rate to an equal-diameter flow rate, and the equal-diameter flow rate is less than the second initial inert gas flow rate.

It can be understood that the growth length of the crystal in the equal-diameter process can be described in following three stages: the length of the entry section in the first equal-diameter stage, the length of the growth section in the second equal-diameter stage, and the length of the stabilization section in the third equal-diameter stage. In each equal-diameter stage, the inert gas flow rate is controlled so as to avoid the uneven distribution of the impurity concentration in the radial direction of the crystal, suppress the attenuation rate of the resistivity of the crystal, and improve the uniformity of the radial resistivity of the crystal. From the first equal-diameter stage to the third equal-diameter stage, the inert gas flow rate is first set to the first initial inert gas flow rate in the first equal-diameter stage. After the first equal-diameter stage, the inert gas flow rate is gradually increased from the first initial inert gas flow rate to the equal-diameter flow rate. In the cooling process, the inert gas flow rate is adjusted to a second initial inert gas flow rate, where the equal-diameter flow rate is less than the second initial inert gas flow rate. For example, the first initial inert gas flow rate may be 80 liter per minute (LPM), the equal-diameter flow rate can be 100 LPM, and the second initial inert gas flow rate may be 120 LPM. That is, the inert gas flow rate is set to the first initial inert gas flow rate of 80 LPM in the first equal-diameter stage. After the first equal-diameter stage, the inert gas flow rate is gradually increased from the first initial inert gas flow rate of 80 LPM to the equal-diameter flow rate of 100 LPM. The inert gas flow rate is adjusted to the second initial inert gas flow rate of 120 LPM in the cooling process, thereby accelerating the volatilization of silicon oxide gas, reducing the oxygen content in the silicon liquid, and making the growth interface of the crystal smoother. Therefore, the uniformity of the radial resistivity of the crystal and the crystallization rate and the yield can be improved.

It is to be noted that the inert gas can be argon.

Optionally, from the first cooling stage to the third cooling stage, the furnace pressure is gradually reduced from the second initial furnace pressure to a cooling furnace pressure and the inert gas flow rate is gradually increased from the second initial inert gas flow rate to a cooling flow rate.

It can be understood that the cooling process of the crystal includes three stages: the first cooling stage, the second cooling stage, and the third cooling stage. In each cooling stage, the furnace pressure and the inert gas flow rate are controlled, so as to avoid uneven distribution of impurity concentration in the radial direction of the crystal, suppress the attenuation rate of resistivity of the crystal, and improve the uniformity of the radial resistivity of the crystal. From the first cooling stage to the third cooling stage, the furnace pressure is gradually reduced from the second initial furnace pressure to the cooling furnace pressure after starting at the second initial furnace pressure. For example, the second initial furnace pressure may be 8 Torr, and the cooling furnace pressure can be 6 Torr. That is, the furnace pressure is gradually reduced from the second initial furnace pressure of 8 Torr to the cooling furnace pressure of 6 Torr after starting at the second initial furnace pressure of 8 Torr. The inert gas flow rate is gradually increased from the second initial inert gas flow rate to the cooling flow rate. For example, the second initial inert gas flow rate can be 120 LPM, and the cooling flow rate can be 150 LPM, that is, the inert gas flow rate is gradually increased from the second initial inert gas flow rate of 120 LPM to the cooling flow rate of 150 LPM, so as to quickly cool the crystals coming out of furnace at high temperature, and eliminate some original oxygen heat donors, and promote oxygen precipitation, thereby improving the uniformity of the radial resistivity of the crystals, and improving the crystallization rate and the yield.

It is to be noted that the inert gas can be argon.

Optionally, the crystal has a growth length in a range of 0 mm to 600 mm in the first equal-diameter stage, has a growth length in a range of 600 mm to 1500 mm in the second equal-diameter stage, and has a growth length in a range of 1500 mm to 5000 mm in the third equal-diameter stage.

It can be understood that, in the embodiments, the diameter of the crystal is assumed to be 253 mm, and the growth length of the crystal in the equal-diameter process can be described in three stages: the length of the crystal in the first equal-diameter stage is 0 mm to 600 mm (for example, 100 mm, 300 mm, or 500 mm), the length of the crystal in the second equal-diameter stage is 600 mm to 1500 mm (for example, 700 mm, 1000 mm, or 1500 mm), and the length of the crystal in the third equal-diameter stage is 1500 mm to 5000 mm (for example, 2000 mm, 3000 mm, or 4000 mm). In each equal-diameter stage, the crystal rotation rate, the crucible rotation rate, the furnace pressure, and the inert gas flow rate for crystal growth are controlled, so as to avoid the uneven distribution of impurity concentration in the radial direction of the crystal, suppress the attenuation rate of the resistivity of the crystal, and improve the uniformity of the radial resistivity of the crystal. In the first equal-diameter stage, the length of the crystal is 0 mm-600 mm, since the crystal rotation rate and the crucible rotation rate are gradually increased, the melt below the solid-liquid interface flows upward under the action of rotation of the crystal, and the temperature of the melt at the solid-liquid interface rises continuously. The increase of the temperature of the melt at the solid-liquid interface can effectively avoid undercooling and improve the stability of the growth of the crystal. In the second equal-diameter stage, the length of the crystal is 600 mm-1500 mm, to maintain stable crystal growth and reduce the influence of hot air flow of the melt on the solid-liquid interface, the crystal rotation rate and the crucible rotation rate each are kept at a rotation rate at the end of the first equal-diameter stage. In the third equal-diameter stage, the length of the crystal is 1500 mm-5000 mm, the crystal rotation rate is kept unchanged, and the crucible rotation rate is gradually reduced, so that the forced convection of silicon liquid in the crucible can be changed, the convex degree of the growth interface of the crystal can be reduced to suppress appearance of facets, and the inhibition effect on thermal convection at the growth interface can be enhanced. Therefore, it is possible to avoid the uneven distribution of the radial resistivity of the crystal due to the temperature fluctuation of the solid-liquid interface caused by the thermal convection, and improve the uniformity of the radial resistivity of the crystal. In addition, the low crucible rotation rate reduces the erosion and corrosion of silicon liquid to walls of the crucible, and a reaction speed of chemical reaction between the silicon liquid and the crucible is correspondingly slowed down, thus reducing the generation of oxygen. The convection speed of the silicon liquid is reduced, which reduces the oxygen entering the crystal-induced silicon liquid, such that the oxygen content at the head of the crystal rod in the generated monocrystalline silicon rod is obviously reduced, and the quality of the monocrystalline silicon can be improved. The furnace pressure is gradually decreased, inert gas is filled at the first initial inert gas flow rate in the and the inert gas flow rate is gradually increased after the first equal-diameter stage, thereby accelerating the volatilization of silicon oxide gas, reducing the oxygen content in the silicon liquid, and making the growth interface of the crystal smoother. Therefore, the uniformity of the radial resistivity of the crystal and the crystallization rate and the yield can be improved.

It is to be noted that the embodiments may only be described with a crystal having a diameter of 253 mm as an example, and the diameter of the crystal may be 210 mm, 250 mm, 290 mm, or 330 mm, etc., which are not limited herein. If the diameter of the crystal is of other lengths, a range of the crystal length in the first equal-diameter stage, a range of the crystal length in the second equal-diameter stage, and a range of the crystal length in the third equal-diameter stage also need to be adjusted accordingly.

Optionally, a cooling time of the first cooling stage and the second cooling stage is 1800 s, and a cooling time of the third cooling stage is 4200 s.

It can be understood that the cooling process of the crystal includes three stages, the cooling time of the first cooling stage and the second cooling stage is 1800 s, and the cooling time of the third cooling stage is 4200 s. In each cooling stage, the crystal rotation rate, the crucible rotation rate, the furnace pressure, and the inert gas flow rate are controlled, so as to avoid uneven distribution of impurity concentration in the radial direction of the crystal, suppress the attenuation rate of resistivity of the crystal, and improve the uniformity of the radial resistivity of the crystal. From the first cooling stage to the third cooling stage, the crystal rotation rate is kept constant after being stated at the second initial crystal rotation rate, and the crucible rotation rate is kept constant after being stated at the second initial crucible rotation rate. The furnace pressure is gradually decreased after being stated at the second initial furnace pressure, and the inert gas flow rate is gradually increased after being stated at the second initial inert gas flow rate, so as to quickly cool the crystals coming out of furnace at high temperature, eliminate some original oxygen heat donors, and promote oxygen precipitation, thereby improving the uniformity of the radial resistivity of the crystals, and improving the crystallization rate and the yield.

It is to be noted that there is no restriction on the cooling time of the first cooling stage, the second cooling stage, and the third cooling stage, and the cooling time of the first cooling stage and the second cooling stage may be 1500 s, 2000 s, and 22000 s, and the cooling time of the third cooling stage may be 3800 s, 4000 s, and 4500 s, etc.

As can be seen from the above embodiments, the method for crystal pulling provided in the disclosure at least realizes the following beneficial effects.

According to the method for crystal pulling provided in the disclosure, by sequentially adjusting the crystal rotation rate, the crucible rotation rate, the furnace pressure, and the flow rate of the inert gas in the equal-diameter process and the crystal rotation rate, the crucible rotation rate, the furnace pressure and the inert gas flow rate in the cooling process according to the growth length of the crystal, the uneven distribution of impurity concentration in the radial direction of the crystal is avoided, and the attenuation rate of the resistivity of the crystal is suppressed to improve the uniformity of radial resistivity of the crystal. From the first equal-diameter stage to the third equal-diameter stage, the crystal rotation rate is gradually increased to the maximum rotation rate after the crystal is rotated starting at the first initial crystal rotation rate and the crucible rotation rate is gradually increased to the maximum rotation rate after the crucible is rotated starting at a first initial crucible rotation rate. Therefore, the temperature of the melt at the solid-liquid interface rises continuously and the increase of the temperature of the melt at the solid-liquid interface can effectively avoid undercooling and improve the stability of the growth of the crystal. In order to maintain stable growth of the crystal and reduce the influence of hot air flow of the melt on the solid-liquid interface, the crystal rotation rate and the crucible rotation rate each are kept at a rotation rate at the end of the first equal-diameter stage. When the crystal grows to a certain length, the crystal rotation rate is kept unchanged, and the crucible rotation rate is gradually reduced, so that the forced convection of silicon liquid in the crucible can be changed, the convex degree of the growth interface of the crystal can be reduced to suppress appearance of facets, and the inhibition effect on thermal convection at the growth interface can be enhanced. Therefore, it is possible to avoid temperature fluctuation of the solid-liquid interface caused by the thermal convection and improve the uniformity of the radial resistivity of the crystal. In addition, the low crucible rotation rate reduces the erosion and corrosion of silicon liquid to walls of the crucible, thus reducing the generation of oxygen. Therefore, the oxygen content at the head of the crystal rod in the generated monocrystalline silicon rod is obviously reduced, and the quality of the monocrystalline silicon can be improved. The furnace pressure is gradually decreased after starting at the first initial furnace pressure, the inert gas is filled at the first initial inert gas flow rate in the first equal-diameter stage, and the flow rate of the inert gas is gradually increased after the first equal-diameter stage, thereby accelerating the volatilization of silicon oxide gas, reducing the oxygen content in the silicon liquid, and making the growth interface of the crystal smoother. Therefore, the uniformity of the radial resistivity of the crystal and the crystallization rate and the yield can be improved.

While some particular embodiments of the disclosure have been described in detail by way of example it will be understood by those skilled in the art that the above examples are for illustration only and are not intended to limit the scope of the disclosure. It can be understood by those skilled in the art that modifications may be made to the above embodiments without departing from the scope and spirit of the disclosure. The scope of the disclosure is defined by the appended claims.

What is claimed is:

1. A method for crystal pulling, comprising:
performing an equal-diameter process, wherein the equal-diameter process is divided into a first equal-diameter stage, a second equal-diameter stage, and a third equal-diameter stage in turn according to a growth length of crystal, and wherein performing the equal-diameter process comprises sequentially adjusting a crystal rotation rate, a crucible rotation rate, a furnace pressure, and an inert gas flow rate, including:
from the first equal-diameter stage to the third equal-diameter stage, increasing the crystal rotation rate after starting at a first initial crystal rotation rate, and keeping the crystal rotation rate at a constant rotation rate after increasing the crystal rotation rate;
increasing the crucible rotation rate from a first initial crucible rotation rate to a maximum crucible rotation rate after starting at the first initial crucible rotation rate in the first equal-diameter stage, keeping the crucible rotation rate at the maximum crucible rotation rate in the second equal-diameter stage, and decreasing the crucible rotation rate after the second equal-diameter stage; and
decreasing the furnace pressure after starting at a first initial furnace pressure, starting at a first initial inert gas flow rate in the first equal-diameter stage and increasing the inert gas flow rate after the first equal-diameter stage; and
performing a cooling process in which a furnace pressure and an inert gas flow rate are sequentially adjusted.

2. The method of claim 1, wherein:
the cooling process is divided into a first cooling stage, a second cooling stage, and a third cooling stage; wherein performing the cooling process comprises:

from the first cooling stage to the third cooling stage: keeping the crystal rotation rate at a second initial crystal rotation rate after starting at the second initial crystal rotation rate, keeping the crucible rotation rate at a second initial crucible rotation rate after starting at the second initial crucible rotation rate, reducing the furnace pressure after starting at a second initial furnace pressure, and increasing the inert gas flow rate after starting at a second initial inert gas flow rate.

3. The method of claim 2, wherein the first initial crystal rotation rate is less than the second initial crystal rotation rate, the first initial crucible rotation rate is greater than the second initial crucible rotation rate, the first initial furnace pressure is greater than the second initial furnace pressure, and the first initial inert gas flow rate is less than the second initial inert gas flow rate.

4. The method of claim 2, wherein:
in the first equal-diameter stage, the crystal rotation rate is increased from the first initial crystal rotation rate to an equal-diameter crystal rotation rate; and
in the second equal-diameter stage and the third equal-diameter stage, the crystal rotation rate is kept at the equal-diameter crystal rotation rate; wherein
the equal-diameter crystal rotation rate is the second initial crystal rotation rate.

5. The method of claim 4, wherein the first initial crystal rotation rate is 8 rotations per minute (RPM), the equal-diameter crystal rotation rate is 10 RPM, and the second initial crystal rotation rate is 10 RPM.

6. The method of claim 2, wherein:
in the third equal-diameter stage, the crucible rotation rate is decreased from the maximum crucible rotation rate to an equal-diameter crucible rotation rate, wherein the equal-diameter crucible rotation rate is less than the first initial crucible rotation rate, and the equal-diameter crucible rotation rate is greater than the second initial crucible rotation rate.

7. The method of claim 6, wherein the first initial crucible rotation rate is 6 RPM, the maximum crucible rotation rate is 9 RPM, the equal-diameter crucible rotation rate is 5 RPM, and the second initial crucible rotation rate is 2 RPM.

8. The method of claim 2, wherein:
in the equal-diameter process, the furnace pressure is decreased from the first initial furnace pressure to an equal-diameter furnace pressure, wherein the equal-diameter furnace pressure is the second initial furnace pressure.

9. The method of claim 8, wherein the first initial furnace pressure is 13 Torr, the equal-diameter furnace pressure is 8 Torr, and the second initial furnace pressure is 8 Torr.

10. The method of claim 2, wherein:
in the equal-diameter process, the inert gas flow rate is increased from the first initial inert gas flow rate to an equal-diameter flow rate, wherein the equal-diameter flow rate is less than the second initial inert gas flow rate.

11. The method of claim 10, wherein the first initial inert gas flow rate is 80 liter per minute (LPM), the equal-diameter flow rate is 100 LPM, and the second initial inert gas flow rate is 120 LPM.

12. The method of claim 2, wherein:
from the first cooling state to the third cooling state, the furnace pressure is decreased from the second initial furnace pressure to a cooling furnace pressure, and the inert gas flow rate is increased from the second initial inert gas flow rate to a cooling flow rate.

13. The method of claim 12, wherein the second initial furnace pressure is 8 Torr, and the cooling furnace pressure is 6 Torr.

14. The method of claim 1, wherein the crystal has a growth length in a range of 0 mm to 600 mm in the first equal-diameter stage, a growth length in a range of 600 mm to 1500 mm in the second equal-diameter stage, and a growth length in a range of 1500 mm to 5000 mm in the third equal-diameter stage.

15. The method of claim 2, wherein a cooling time of the first cooling stage and the second cooling stage is 1800 s, and a cooling time of the third cooling stage is 4200 s.

16. The method of claim 2, wherein a cooling time of the first cooling stage and the second cooling stage is 1500 s, 2000 s or 2200 s, and a cooling time of the third cooling stage is 3800 s, 4000 s, or 4500 s.

* * * * *